United States Patent [19]

Yamada

[11] Patent Number: 4,554,485
[45] Date of Patent: Nov. 19, 1985

[54] SOLID-STATE IMAGE DISPLAY DEVICE

[75] Inventor: Takahiro Yamada, Hirakata, Japan

[73] Assignee: Matsushita Electric Industrial Co., Ltd., Osaka, Japan

[21] Appl. No.: 495,413

[22] Filed: May 17, 1983

[30] Foreign Application Priority Data

May 20, 1982 [JP] Japan .................. 57-85841

[51] Int. Cl.[4] .............................................. H01J 7/44
[52] U.S. Cl. .................. 315/169.3; 313/500; 313/501; 340/719; 340/781; 340/782; 357/17; 357/41
[58] Field of Search ....................... 357/17, 15, 30, 45, 357/22, 15, 17, 22, 30, 41; 313/500, 501, 502, 503, 500, 501, 502, 503; 315/169.3; 358/241; 340/719, 781, 782

[56] References Cited

U.S. PATENT DOCUMENTS 3,564,135 2/1971 Weimer .................. 358/241
3,806,759 3/1974 Kabaservice et al. .......... 357/17

OTHER PUBLICATIONS

Morenza et al., Vps Voltage Capabilites of a Diffused JF.E.T., with a vertical channel Arrangement, Apr. 17, 1975, Electronics Letters, vol. 11, No. 8, pp. 172-173.

Primary Examiner—James W. Davie
Assistant Examiner—Georgia Y. Epps
Attorney, Agent, or Firm—Stevens, Davis, Miller & Mosher

[57] ABSTRACT

A solid-stage image display device is disclosed in which an electron injection region of high impurity density is formed on a surface of a semiconductor substrate of low impurity density, while a phosphor region of electron excitation type is formed on the other surface of the semiconductor substrate. Light is emitted from the phosphor region by the electrons running non-scattered i.e., the running distance of the carriers is shorter than the mean free path thereof within the substrate along the thickness thereof. The amount of electrons required for luminescence and injected into the substrate is controlled and the light-emitting position is selected by a drive control region provided in the semiconductor substrate between the electron injection region and the phosphor region. The drive control region provides a potential barrier against the electrons to the potential distribution in the substrate, wtih the height of the potential barrier being controlled by the voltage applied to the drive control region.

4 Claims, 22 Drawing Figures

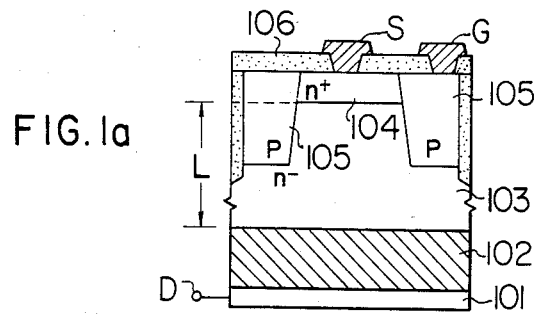
FIG. 1a
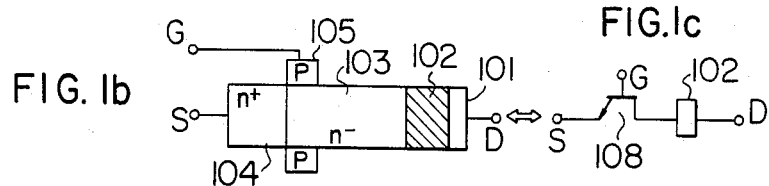
FIG. 1b
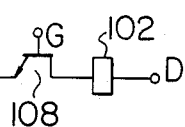
FIG. 1c
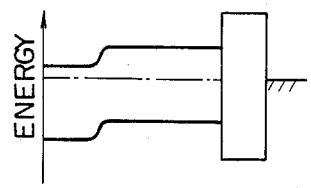
FIG. 1d
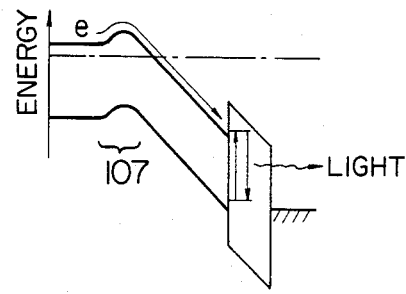
FIG. 1e
FIG. 2
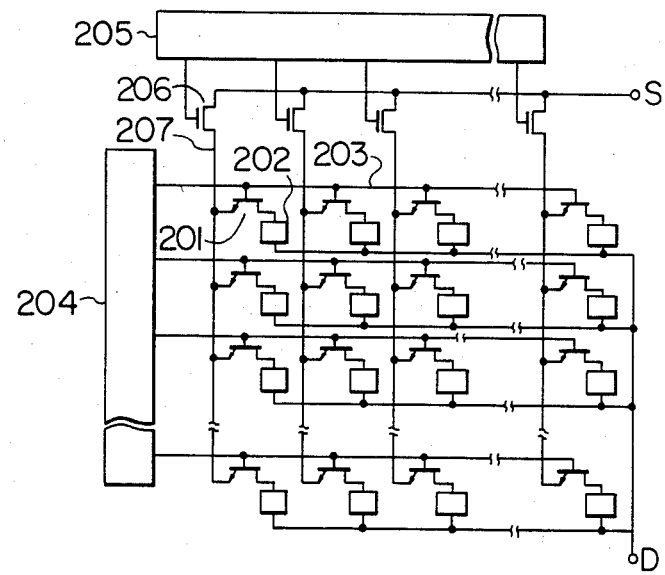

FIG. 3a
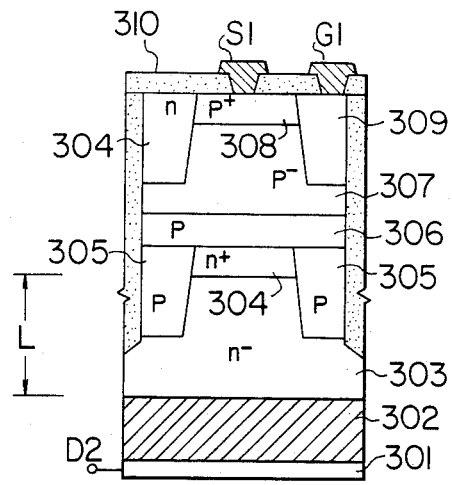
FIG. 3c
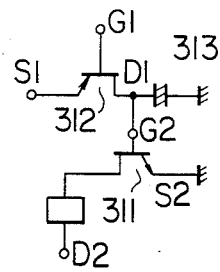
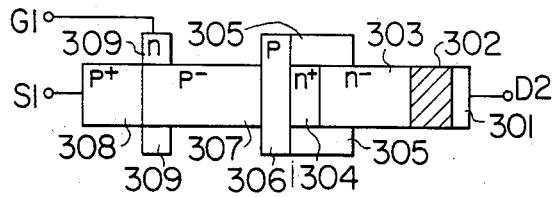
FIG. 3b
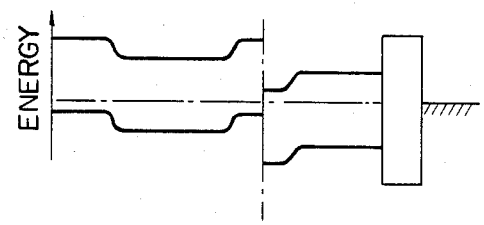
FIG. 3d
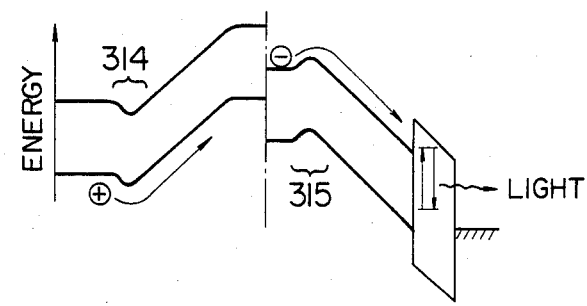
FIG. 3e FIG. 4
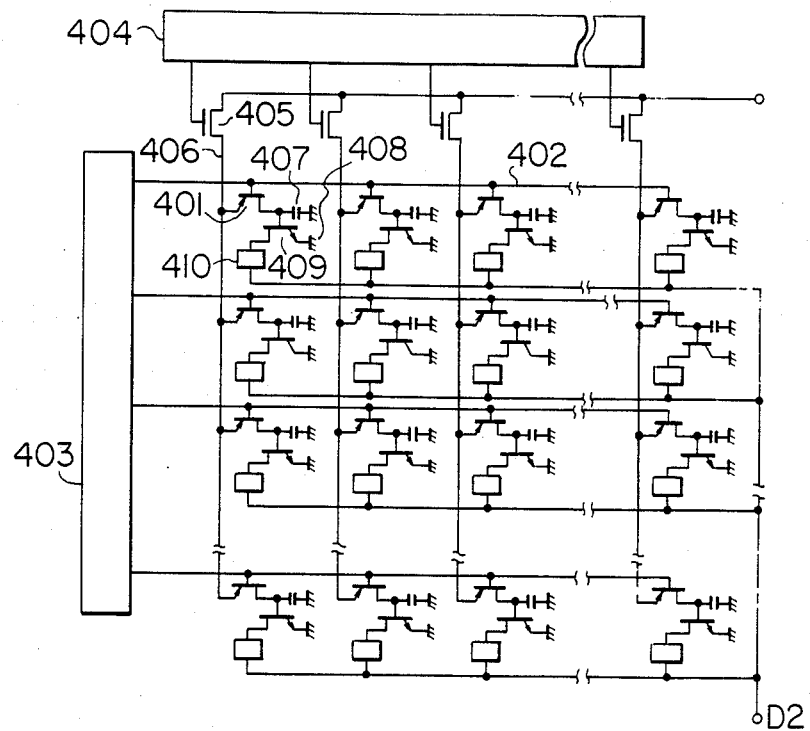
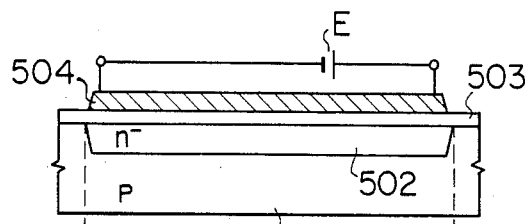
FIG. 5a
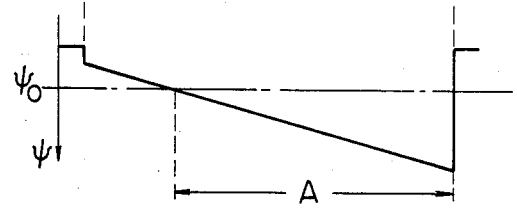
FIG. 5b

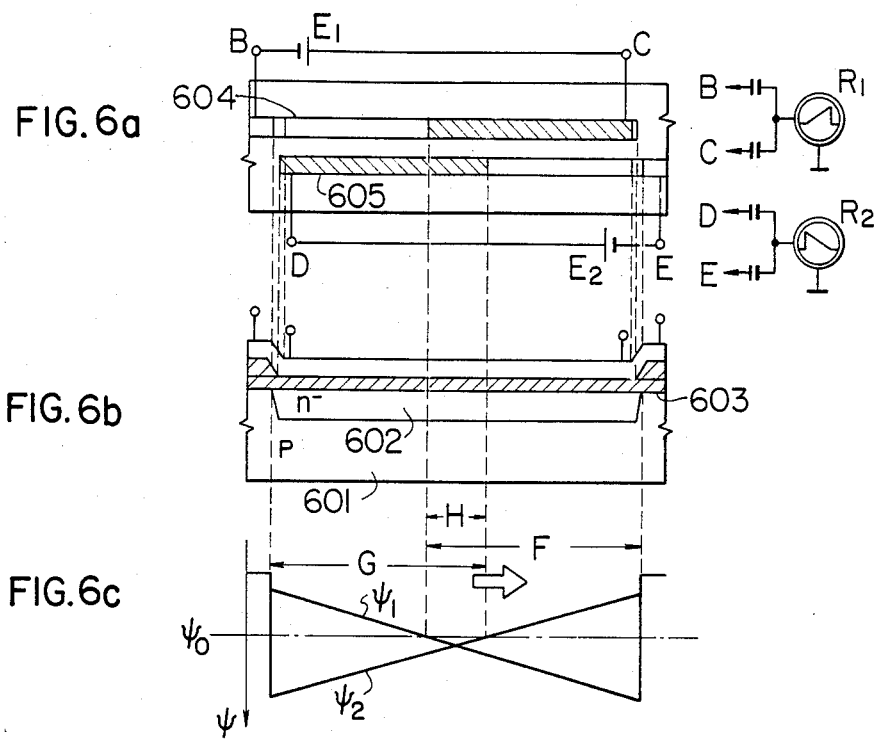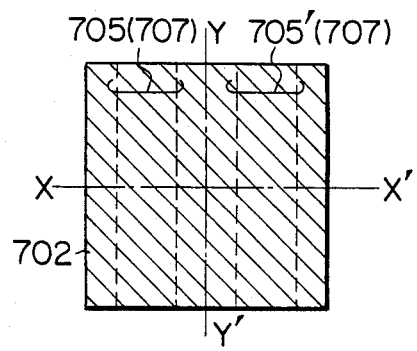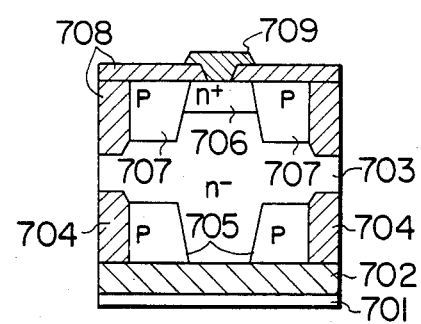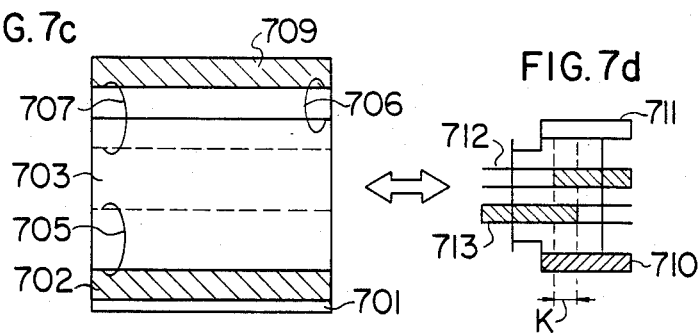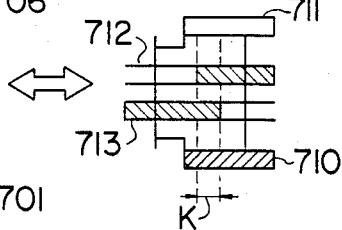

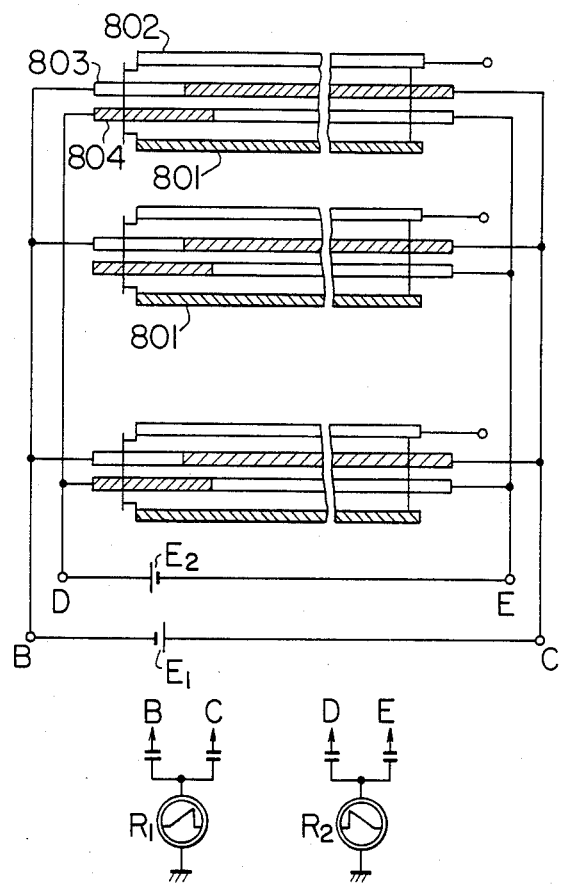

SOLID-STATE IMAGE DISPLAY DEVICE

BACKGROUND OF THE INVENTION

1. Field of the Invention

The present invention relates to a novel solid-state image display device in which an electron excitation type luminescence of high efficiency is caused in a phosphor material by use of electrons running unscattered in a solid, such that the running distance of carriers is shorter than the mean free path thereof.

2. Description of the Prior Art

Conventional solid-state elements suggested for use in flat-type image display devices include a light-emitting diode (LED) and an electroluminescent (EL) device. All such elements are quite inferior to the cathode ray tube (CRT) in brightness, response characteristic, tone characteristic, color reproducibility and power consumption.

The LED is small in the light-emitting area and unless the power consumption thereof is reduced to one-thousandth of the present level, it is very difficult to realize a flat-type image display apparatus with it.

The EL is low in light-emitting efficiency, on the other hand, and requires a high operating voltage, and therefore is hard to form in an integrated circuit construction which is indispensable for realizing a compact flat-type image display system.

SUMMARY OF THE INVENTION

Accordingly, the object of the present invention is to provide a novel full-solid image display device in which a highly efficient luminescence of electron excitation type is caused in a phosphor material by use of electrons running unscattered in a solid material.

Since non-scattered running of electrons is also called "ballistic running," the solid-state image display apparatus according to the present invention will hereinafter be referred to as a "ballistic electro-luminescence apparatus (BEL)."

The apparatus according to the present invention fundamentally comprises (1) a solid-state electron-running section and (2) a phosphor section. The electron running section is made of a polar crystal material expected to produce a high screening effect against scattering in order to secure non-scattered running of electrons. The electron running section is so constructed that the running distance thereof is shorter than the mean free path of the electrons.

In the phosphor section, on the other hand, the recombination energy of electron-hole pairs generated by the electrons running unscattered themselves, or the secondary electrons caused by the nonelastic collision between the non-scattered electrons and free electrons or bound electrons excites the activation agent of the phosphor material, thereby causing luminescence.

The BEL according to the present invention has capabilities surpassing those of the CRT in all respects and is a pioneer of a full-scale practical flat-type image display system.

BRIEF DESCRIPTION OF THE DRAWINGS

FIG. 1(a) is a sectional view showing a first embodiment of a solid-state image display apparatus of the present invention;

FIG. 1(b) is a diagram showing an equivalent construction of FIG. 1(a);

FIG. 1(c) is a diagram showing an equivalent circuit of FIG. 1(b) actually applied for the invention;

FIG. 1(d) shows an energy band diagram in a state of thermal equilibrium;

FIG. 1(e) shows an energy band diagram when a predetermined voltage is applied to electrodes of FIG. 1(c);

FIG. 2 is a block diagram showing a configuration of a solid-state image display apparatus with image cells (see FIG. 1(c)) arranged two-dimensionally and also scanning circuits;

FIG. 3(a) is a sectional view showing a second embodiment of the display apparatus of the invention;

FIG. 3(b) is a diagram showing an equivalent structure of FIG. 3(a);

FIG. 3(c) is a diagram showing an equivalent circuit of FIG. 3(b) actually applied for the invention;

FIG. 3(d) shows an energy band diagram in a state of thermal equilibrium;

FIG. 3(e) shows an energy band diagram when a predetermined voltage is applied to electrodes of FIG. 3(c);

FIG. 4 is a block diagram showing a construction of a solid-state image display apparatus with the image cells (see FIG. 3(c)) thereof arranged two-dimensionally;

FIG. 5(a) is a sectional view showing a fundamental resistive gate electrode;

FIG. 5(b) is a diagram showing a potential distribution of FIG. 5(a);

FIG. 6(a) is a top plan view showing a scanning circuit including a pair of resistive gate electrodes;

FIG. 6(b) is a sectional view of FIG. 6(a);

FIG. 6(c) is a diagram showing a potential distribution of FIG. 6(a);

FIG. 7(a) is a bottom plan view showing a third embodiment of the apparatus of the invention;

FIG. 7(b) is a sectional view of FIG. 7(a) taken along the line X—X';

FIG. 7(c) is a sectional view of FIG. 7(a) taken along the line Y—Y';

FIG. 7(d) is a diagram showing an equivalent circuit of FIG. 7(c); and

FIG. 8 is a block diagram showing a construction of a solid-state image display apparatus with basic image cells thereof enlarged two-dimensionally and scanning circuits with resistive gate electrodes.

DESCRIPTION OF THE PREFERRED EMBODIMENTS

(i) Theory

Before a description of the various embodiments of the present invention is provided, a theoretical ground for realizing carriers running in a non-scattered manner in a solid will be clarified below.

First, the CRT will be discussed.

Generally, the velocity v of electrons emitted at an initial velocity $v_o$ from a cathode having a potential $V_o$, at the instant when they reach the anode of potential V over the distance d ($V - V_o$ being about 1 to 10 KV), is expressed as $$\tfrac{1}{2}m(v^2 - v_o^2) = q(V - V_o) = qED \qquad (1)$$

where m is the rest mass ($9.107 \times 10^{-31}$ kg) of electrons in vacuum, q is the quantity of electron charges ($1.602 \times 10^{-19}$ C), and $$E = \frac{V - V_o}{d} \text{ (electric field)}.$$

By way of simplification, assume that $v_o=0$, and $V_o = 0$, and Equation (1) is rewritten as $$v = \left(\frac{2qV}{m}\right)^{\frac{1}{2}} \quad (2)$$

Substituting the typical voltage $V=2$ KV used for a CRT into this Equation, $$v = 3.6 \times 10^9 \text{ cm/sec}$$

A small proportion of electrons impinging at high speed on the phosphor, such as in a CRT, are elastically reflected on the surface layer of the phosphor and become back-scattered electrons having an energy as much as or smaller than the incident electrons. It is said, however, that a great proportion of the electrons, after penetrating the crystal by a certain distance in accordance with the speed thereof are diffused for excitation. (See Khrenberg, W. et al: *Proc. Phy. Soc.* (London), B66, p. 1057 (1953).)

The electrons that have successfully made their way into the phosphor crystal generate secondary electrons by nonelastic collision with free electrons or bound electrons, thus gradually losing their energy. The secondary electrons are converted sequentially into electron-hole pairs of lower energy, and finally the electron-hole pairs are separated. The recombination energy thereof is considered to excite the activation agent of the phosphor.

In the CRT, the electrons, which fly from the vacuum into a solid, should decrease in speed in the latter material.

The behavior of the electrons in the solid will now be examined.

The velocity v of electrons running in a solid under an electric field E is generally given as:

$$v^* = \frac{q\tau E}{m^*}(1 - e^{-t/\tau}) \quad (3)$$

where m* is the effective mass of the electrons, and $\tau$ the relaxation time (or average collision time).

When $(t/\tau) \gg 1$ in Equation (3) above, the velocity $v^*$ becomes the drift velocity $v_d^*$ shown below.

$$v_d^* = \frac{q\tau E}{m^*} = \mu E \quad (4)$$

where $$\mu = \frac{q\tau}{m^*}$$

(mobility or drift velocity in the unit electric field).

Equation (4) indicates that the drift velocity of electrons $v_d^*$ is proportional to the electric field E. The relaxation time $\tau$ providing a factor is determined by the scattering caused by various imperfections disturbing the period of the lattice of the crystal.

Typical mechanisms causing scattering include:
(1) collision with lattice vibrations (phonons),
(2) collision with ionized impurities, and
(3) collision with neutral impurities (such as dislocation, vacant holes and atoms between lattices).

If the relaxation time against the scatterings caused by (1) to (3) are given as $\tau_L$, $\tau_I$ and $\tau_N$, respectively, the relation $$\frac{1}{\tau} = \frac{1}{\tau_L} + \frac{1}{\tau_I} + \frac{1}{\tau_N} \quad (5)$$

is obtained.

Thus, if the drift velocity $v_d^*$ is to be increased, the values $\tau_L$, $\tau_I$ and $\tau_N$ are required to be increased, that is, the scattering must be decreased.

In a crystal of high purity, the most important mechanism of scattering at room temperature is provided by phonons. The scattering by phonons is roughly divided into the accoustic mode and the optical mode.

In the acoustic mode involving a smaller excitation energy $\omega$, the activation agent is excited easily thermally even at room temperature. In the case of nonpolar semiconductors, such as Ge or Si, the scattering in acoustic mode is controlling, while the optical mode is common for the ionic crystals, such as NaCl. The polar semiconductors, such as those from the III–V or II–VI group, exhibit an intermediate property, and the controlling scattering mode thereof changes with temperature.

The linear relation between the drift velocity $v_d^*$ of electrons and the electric field E shown by Equation (4) ceases to hold with the increase of the electric field E. This is explained by the fact that when the electric field increases, the energy that has been absorbed from the electric field by the electrons fails to be fully discharged into the lattice by collision with the acoustic phonons, so that the scattering time $\tau$ is shortened. (In the process, the electrons are called the hot electrons, since the electron temperature Te is higher than the lattice temperature $T_L$.) When the electric field intensity further increases to such an extent that the electron energy reaches the level of the optical phonons and the electrons collide with such phonons, the cause of scattering changes from the reaction with acoustic phonons to the reaction with optical phonons.

In the reaction with optical phonons, a great amount of the energy of the electrons is lost each time a collision occurs, so that the drift velocity $v_d^*$ reaches a predetermined saturation velocity $v_{ds}^*$, as expressed below:

$$v^*_{ds} = \frac{1}{2}\left(\frac{2\omega_{OP}}{m^*}\right)^{\frac{1}{2}} \quad (6)$$

where $\omega_{OP}$ is the energy of optical phonons.

This saturation velocity $v_{ds}^*$ is obtained at an electric field of approximately $10^5$ V/cm, and takes the values specified below for typical semiconductors.

Ge, Si ... Approximately $10^7$ cm/sec
GaAs ... Approximately $2 \times 10^7$ cm/sec
InP ... Approximately $2.5 \times 10^7$ cm/sec
InAs ... Approximately $3.5 \times 10^7$ cm/sec When an electric field beyond the saturation velocity $v_{ds}^*$ is applied, the mean energy of the conduction electrons accelerated by the electric field is increased beyond the energy for generation of electron-hole pairs, and the electrons in the valence band are ionized by collision with high energy electrons, with the result that these electrons are excited into the conduction band, thereby producing free electron-hole pairs.

Before this ionization by collision, the electrons are required to be accelerated by the electric field without collision to such a degree as to acquire an energy higher than the ionization threshold energy $\epsilon_i$.

The distance r, by which electrons under the electric field E are required to be accelerated without collision up to the threshold energy $\epsilon_i$ of ionization by collision, is given as:

$$r = \frac{\epsilon_i}{qE} \tag{7}$$

If the mean free path of electrons is represented by $l_0$, the ratio R of the electrons covering the distance r without collision to the total number of electrons is expressed as:

$$R = \exp\left(-\frac{r}{l_0}\right) \tag{8}$$

The ratio $R\epsilon_i$ of electrons accelerated up to the energy $\epsilon_i$ is thus:

$$R\epsilon_i = \exp\left(-\frac{\epsilon_i}{qEl_0}\right) \tag{9}$$

In the CRT, electrons entering from vacuum into a solid slow down in speed at a rate that can be inferred from an experiment conducted on the thin film EL. This is because in the case of EL, it is known that the electrons accelerated by the high electric field excite the activation agent of the phosphor by direct collision therewith.

It is reported that a thin-film EL with a voltage applied only to ZnS thin film of the light-emitting layer, which operates at an operating voltage of 20 to 60 V and an electric field as high as $10^6$ V/cm, has recently been developed. (See the *TV Society Technological Report IPD* 57-6, pp. 35 to 40, 1981.) According to this report, the luminescence of electron excitation type is generated in EL under an electric field about ten times higher than the intensity $10^5$ V/cm of the electric field, which causes the saturation velocity of $v_{ds}^*$ in a semiconductor. Considering this electric field in Equation (2) above, the electron velocity for causing the luminescence of electron excitation type in a semiconductor is required to be:

$$v^* > 3 \times 10^7 \text{ to } 10^8 \text{ cm/sec} \tag{10}$$

(EL, in spite of the high electric field it uses to satisfy the condition of Equation (10), is very low in efficiency since it is dependent on the lucky electrons that happen to escape collision with phonons, as expressed by $R\epsilon_i$ in Equation (9). On the other hand, to the extent that the velocity of electrons running in an ordinary semiconductor is under the control of Equation (3), it will be seen that the EL is about the only means resulting in luminescence of electron excitation type.)

If the condition of Equation (10) is to be met in a solid, it is necessary that:

(I) scattering which dampens the velocity increases be controlled by the shield effect (or screening effect) of carriers, and (II) the distance coverage L of electrons be reduced below the mean free path $l_0$, that is $$L < l_0 \tag{11}$$

The shield effect of carriers is the phenomenon in which the coulomb field is formed by ionized impurities is shielded by the redistribution of electrons thereby to reduce scattering when the relation holds that:

$$n_e > N_d \tag{12}$$

in which the impurities density $N_d$ at the electron-running section is reduced, while increasing the density $n_e$ of the electrons forming the conduction carriers. (This compares with the relation $n_e \simeq N_d$ for ordinary devices.)

In the above-mentioned scattering mechanism, (a) scattering caused by optical phonons and (b) scattering caused by ionized impurities, are expected to be reduced remarkably by the shield effect.

A device therefore is desirable which by use of a polar crystal material, such as GaAs, InP or InAs, satisfies the condition of Equation (12).

Now, let us discuss the condition of Equation (11). In the event that the distance coverage L of electrons is shorter than the mean free path $l_0$, the running is generally referred to as "non-scattered running."

The mean free path $l_0$ is generally given as:

$$l_0 \simeq \tau v_{th} \simeq \frac{\mu}{q}(3 K_B T_m^*)^{\frac{1}{2}} \tag{13}$$

where $v_{th}$ is the thermal velocity of electrons.

The voltage V* applied across the electron-running section that satisfies the condition (11) for non-scattered running of electrons, on the other hand, is limited by Equation (14) below:

$$\frac{K_B T}{q} < V^* < \frac{\Delta \epsilon}{q} \tag{14}$$

where $\Delta\epsilon$ is the energy gap between the main band and the side band. If $E^* = V^*/L$, then the Equation (14) is rewritten as:

$$\frac{K_B T}{qL} < E^* < \frac{\Delta \epsilon}{qL} \tag{15}$$

As seen from the above, the drift velocity $v_d$ of the electrons satisfying the condition of non-scattered running is expressed, similarly to Equation (1), as shown below:

$$\tfrac{1}{2} m^*(v_d^{*2} - v_{do}^{*2}) = q(V^* - V_o^*) \tag{16}$$

where $v_{do}$ is the initial velocity of electrons. By way of simplification, assume that $v_{do} = 0$ and $V_0 = 0$. Then $$v^*_d = \left(\frac{2qV^*}{m^*}\right)^{\frac{1}{2}} \tag{17}$$

From Equation (13), a material for realizing the non-scattering running of electrons is desirably high in mobility $\mu$ at room temperature.

In the case of InAs, for example, substituting $\mu = 1.6 \times 10^4$ (cm$^2$/V.sec), $T = 300°$ K., and $m = 0.022 \times 9.11 \times 10^{-31}$ (kg) into Equation (13), results in $l_0 \simeq 0.13$ $\mu$m.

Thus, if the device is so constructed as to satisfy condition (12) for realizing the shield effect of carriers, non-scattered running of electrons is obtained sufficiently even when $L = 0.1$ $\mu$m.

In the case of InAs, the condition similar to Equation (14) is:

$$25 \text{ mV} < V^* < 870 \text{ mV}$$

If $V^* = 0.8$ V, the electron velocity $v_d$ is given as $3.5 \times 10^8$ cm/sec from Equation (17). This fully satisfies the condition of Equation (10). In this way, it has become obvious that the construction of the present invention is capable of realizing an electron velocity required for the luminescence of electron excitation type, by the non-scattered running in a solid.

A specific device construction according to the present invention will be described below with reference to the accompanying drawings.

(ii) Application

Explanation will be made of the construction and operation of a basic element according to an embodiment of the present invention with reference to FIG. 1.

FIG. 1(a) shows a sectional view of the element. A phosphor region 102 of electron excitation type and a high-resistivity region 103 are formed in that order on a transparent electrode 101. An n+-type region 104 providing an electron supply source and a p-type region 105 surrounding the n+-type region 104 are formed on the high-resistivity region 103. Further, in an opening of an insulating film 106 formed on the n+-type region 104 and the p-type region 105, the n+-type region 104 is in contact with a source electrode S, while the p-type region 105 is in contact with a gate electrode G. The transparent electrode 101 contacts a drain electrode D. The thickness L of the high-resistivity region 103 is rendered smaller than the mean free path $l_0$ to make the non-scattered running of electrons possible. Also, in order to lengthen the relaxation time by impurity ions, the impurity density of the high-resistivity region 103 providing an electron running region is maintained at $10^{13}$ to $10^{15}$ cm$^{-3}$, while in order to dampen scattering by the shield effect of carriers, the impurity density of the n+-type region 104 is set to $10^{18}$ to $10^{20}$ cm$^{-3}$. The impurity density of the p-type region 105 for controlling the running amount of electrons, on the other hand, is $10^{13}$ to $10^{18}$ cm$^{-3}$.

Furthermore, the phosphor region 102 is of a high-speed electron excitation type used for ordinary CRTs.

FIG. 1(b) is a diagram showing an equivalent construction of FIG. 1(a), and FIG. 1(c) an equivalent circuit used for the description below.

FIG. 1(d) shows an energy band with the voltage $V_S = V_D = 0$[V] applied to the electrodes S and D. FIG. 1(e) shows an energy band with the voltage $V_D$ higher than zero. Under this condition, the high-resistivity region 103 is completely covered by a depletion layer into a pinch-off state, a saddle-shaped potential barrier 107 surrounded by the p-type region 105 develops in front of the n+-type region 104, and the height of this potential barrier 107 mainly functions to control the flow rate of electrons from the n+-type region 104 toward the phosphor region 102. This is an operation similar to that of an SIT (static induction transistor) (see IEEE Trans., ED-22, No. 4, pp. 185–197 (1975)), and therefore this device is designated by the symbol SIT in the equivalent circuit of FIG. 1(c).

From the operation theory of SITs, it is necessary that the relation $r_S \cdot G_m < 1$ holds between the series resistance $r_S$ of the high-resistivity region 103, as viewed from the n+-type region 104 toward the phosphor region 102, and the hypothetical conversion conductance $G_m$ of the potential barrier 107 controlled by the p-type region 105. This SIT 108 representing the function of non-scattered running will hereinbelow be called ideal SIT or i-SIT.

The electrons injected into the high-resistivity region 103 to provide a running region by overcoming the potential barrier 107 intrude into the phosphor region 102 after non-scattered running.

In the case where the phosphor region 102 is of electron excitation type, the intrusion of electrons generates secondary electrons thereby to excite the phosphor material, or the phosphor material is directly excited by the intruding electrons. The phosphor thus excited emits light while being relaxed.

In FIG. 1, whenever the crystallinity of the boundary of the phosphor region 102 of the high-resistivity region 103 is not satisfactory, the electrons that have arrived after non-scattering running are captured or reduced in velocity, thus often decreasing the luminescence efficiency. It is therefore necessary to maintain the boundary in a satisfactory condition by growing the phosphor region or otherwise by molecular beam epitaxy (MBE). On the other hand, if the self-compensation effect is dampened by use of the vapor pressure control temperature method or the like, it is possible to form the non-scattered running section for electrons by a semiconductor material identical or substantially identical to the phosphor region.

FIG. 2 shows a plurality of the basic elements shown in FIG. 1 arranged two-dimensionally to make up a solid-state image display apparatus having a scanning function. (This diagram, however, illustrates a three-dimensional construction two-dimensionally by use of the equivalent circuit of FIG. 1(c).)

In FIG. 2, the drain side of each of the i-SITs arranged in matrix is connected to a phosphor region 202 (although the phosphor regions 202 appear separated from each other in FIG. 2, they are actually formed continuously), so that all the phosphor regions 202 are impressed with a voltage from a terminal D.

The gates of the i-SITs 201 arranged horizontally are connected to horizontal transmission lines 203, each of which is supplied with a voltage as soon as it is selected sequentially by a vertical scanning circuit 204 thereby to turn on the i-SITs 201 involved. In the process, the horizontal scanning circuit 205 turns on horizontal MOS switches 206 sequentially, so that electrons corresponding to the signal are supplied to each vertical transmission line 207 sequentially from the terminal S, and the electrons run through the i-SITs 201 thus turned on thereby to illuminate the phosphor regions 202.

As will be seen from the above, according to the present invention, a fully solid-state image display apparatus that can match a CRT and that has features as described below is realized:

(a) Since the phosphor is excited directly by electrons, the brightness and response characteristic are equal to or superior to those of CRTs.

(b) The non-scattered running of electrons is realized by an ordinary active element such as an i-SIT. Since the control voltage of such an active element is less than several volts, the high-density circuit integration of the drive section as well as a lower power consumption are facilitated.

The solid-state image display apparatus shown in FIG. 2 is such that only the i-SITs 201 selected by vertical and horizontal scannings are turned on and therefore the duration of the time during which the i-SITs are turned on is very short. In the case where the response characteristic of the phosphor region 202 is high, therefore, the brightness thereof may be insufficient.

In such a case, either of two countermeasures may be taken:

(I) The position of the i-SIT selected should be stored in a memory; or (II) A scanning method such as to lengthen the time during which the selected i-SIT is turned on is used.

First, measure (I) will be discussed. FIG. 3 shows a basic element according to another embodiment satisfying the above-mentioned condition.

A sectional view of this basic element is shown in FIG. 3(a). A phosphor region 302 of electron beam excitation type and an n-type high resistivity region 303 (which may be replaced by an intrinsic high-resistivity region) are formed in that order on a transparent electrode 301. Further, an n+-type region 304 providing an electron source and a p-type region 305 surrounding the n+-region 304 are formed on the n-type high-resistivity region 303. (The transparent electrode 301 is connected to a terminal D2, and the n+-type region 304 to a terminal S2. The p-type region 306 is hereinafter sometimes called a G2 electrode. The terminal S2 is normally grounded.)

A p-type region 306 (which may sometimes hereinafter be called a D1 electrode) and a p-type high-resistivity region 307 are formed in that order on the n+-type region 304 and the p-type region 305. Further, a p+-type region 308 providing a hole supply source and an n-type region 309 surrounding the p+-type region 38 are deposited on the p-type high resistivity region 307. (The p+-type region 308 is connected to a terminal S1 and the n-type region 309 is connected to a terminal G1 in the opening of the insulating film 310.)

In the process, the thickness of the n-type high-resistivity region 303 is rendered smaller than the mean free path $l_0$ thereby to realize the non-scattered running of electrons. Also, in order to lengthen the relaxation time caused by the impurity ions, the n-type high-resistivity region 303 providing the electron running section is formed at the impurity density of $10^{13}$ to $10^{15}$ cm$^{-3}$, while, in order to dampen the scattering by the shield effect of carriers, the n+-type region 304 is deposited at the impurity density of $10^{18}$ to $10^{20}$ cm$^{-3}$. On the other hand, the impurity density of the p-type region 305 for controlling the quantity of the running electrons is $10^{13}$ to $10^{18}$ cm$^{-3}$.

The phosphor region 302 of electron excitation type may be of a type generally used with CRTs.

FIG. 3(b) is a diagram showing an equivalent structure of FIG. 3(a), and FIG. 3(c) shows an equivalent circuit used for the description that follows. In FIG. 3(c), SIT 311 will hereinafter be referred to as an ideal SIT or an i-SIT, in the sense that a non-scattered running is realized, while SIT 312 will be called a usual SIT meaning an ordinary SIT and will be abbreviated as a u-SIT. The capacitor 313 corresponds to the function of the p-type region 306 in FIG. 3(a) (the p-type region 305 having the same composition as the p-type region 306), which makes up a floating region for storing the holes injected from the p+-type region 308.

FIG. 3(d) represents an energy band corresponding to the voltage $V_{S1}=V_{D2}=0[V]$ applied to the electrodes S1 and D2. FIG. 3(e), on the other hand, illustrates an energy band corresponding to the relation $V_{D2} 22\ 0$.

The p-type high-resistivity region 307 is completely covered by a depletion layer into a pinch-off state, and a saddle-shaped potential barrier 314 appears at the portion surrounded by the n-type region 309 in front of the p+-type region 308. The height of this potential barrier 314 is controlled also by the voltage applied to the n-type region 309 thereby to control the flow rate of holes from the p+-type region 308 toward the p-type region 306.

At the same time, the n-type high-resistivity region 303 is in a similar condition, so that a saddle-shaped potential barrier 315 presents itself in the portion surrounded by the p-type region 305 in front of the n+-type region 304. The height of this potential barrier 315 is also controlled by the potential of the p-type region 305 in contact with the p-type region 306 thereby to control the flow rate of the electrons from the n+-type region 304 toward the phosphor 302.

The electrons injected into the n-type high-resistivity region 303 overcoming the potential barrier 315 run in non-scattered manner and intrude into the phosphor region 302. The phosphor region 302 is considered quite the same as the phosphor region 102 shown in FIG. 1.

In FIG. 4, the basic elements shown in FIG. 3 are arranged two-dimensionally and make up a solid-state image display apparatus having a scanning function. (In the case of FIG. 4, however, a three-dimensional construction is illustrated two-dimensionally by use of the equivalent circuit of FIG. 3(c). Consequently, the phosphor regions appear to be separated from each other although they are actually formed continuously.)

In the diagram of FIG. 4, each of the gates of the u-SITs 401 arranged in matrix, together with the gates of the other u-SITs arranged in a horizontal direction, is connected to a horizontal transmission line 402, which u-SITs are sequentially scanned by the vertical scanning circuit 403 to apply a voltage to the selected horizontal transmission line 402, thus turning on the u-SITs 401 involved. In the process, the horizontal MOS switches 405 are sequentially turned on by the horizontal scanning circuit 404, so that holes corresponding to the signal are applied sequentially from the terminal S1 to the vertical transmission lines 406. The holes stored in the capacitor 407, through the u-SITs in the "on" state, control the potential barrier of the i-SITs 409 thereby to supply the phosphor region 410 with electrons running non-scattered from the ground 408. (The phosphor region 410 is impressed with a voltage from the terminal D2.) The electrons continue to run non-scattered as long as the holes corresponding to the signal remain stored in the capacitor 407 even after the u-SITs 401 are turned off.

The above completes the explanation of an embodiment representing measure (I) above. Now, measure (II) will be discussed. The important factor in measure (II) is to lengthen the time during which the i-SITs which are selected are turned on.

Assume that an image of one frame is to be displayed for T seconds. When x i-SITs are arranged along each line and y i-SITs along each column, the time t during which each i-SIT is kept turned on is given as:

$$t = \frac{T}{x \cdot y} \quad (18)$$

If the vertical scanning circuits 204 and 403 are excluded and y groups of horizontal MOS switches and terminals S are prepared in FIGS. 2 and 4 in such a way that each group corresponds to each line of i-SITs, then a simultaneous horizontal scanning is attained. Thus, Equation (18) is rewritten as:

$$t' = \frac{T}{x} \quad (19)$$

In this case, however, the use of the horizontal MOS switches of y groups greatly complicates the construction and makes the realization of the intended circuit difficult.

In the event that this concept is furthered by arranging the basic elements of FIGS. 1(a) and 3(a) in matrix without any scanning function for the purpose of simultaneous drive of all the elements, Equation (18) is given as:

$$t'' = T \quad (20)$$

In this case, the problem of turn-on time is eliminated. Since the wiring of x-y wires for simultaneous driving is a problem, however, the driving by photo-electric conversion utilizing optical fibers or the like is required to be considered.

Now, the resolution of the solid-state image display apparatus will be discussed. An increase in the number of the i-SITs in matrix will contribute to an improved resolution. As seen from Equation (18), however, the increase of the i-SITs by x·y results in high-speed operation being required of the scanning circuit, to the great disadvantage in respect of the driving means and power consumption. This is attributable to the fact that all prior art scanning circuits are driven by clock pulses.

A scanning method for achieving a high resolution without using clock pulses will be discussed. A method of scanning without using clock pulses is to utilize a resistive gate electrode.

The fundamental construction of the resistive gate electrode is shown in FIG. 5(a). A resistive gate electrode 504 is formed on an insulating film 503 which in turn is formed on the $n^-$-type region 502 on the p-type substrate 501. When a voltage E is applied across the gate electrode 504, a potential distribution of the $n^-$-type region 502, as shown in FIG. 5(b), is obtained. If the depletion potential of the $n^-$-type region 502 is $\psi = \psi_0$, then the range shown by A corresponds to the depletion region.

For realizing the scanning function by use of this resistive gate electrode, at least a pair of such resistive gate electrodes may be used, as shown in FIG. 6.

FIGS. 6(a) and 6(b) show a top plan view and a sectional view respectively, and FIG. 6(c) shows a potential distribution.

Resistive gate electrodes 604 and 605 are formed, through an insulating film 603, on an $n^-$-type region 602 formed on a p-type substrate 601.

A voltage $E_1$ is applied between the terminals B and C of the resistive gate electrode 604 (the corresponding potential distribution being assumed to be $\psi_1$), and a voltage $E_2$ is supplied between the terminals D and E of the resistive gate electrode 605 (the corresponding potential distribution being $\psi_2$).

If the depletion potential of the $n^-$-type region 602 is $\psi = \psi_0$, the range shown by F provides the depletion region for the resistive gate electrode 604, and the range defined by G that for the resistive gate electrode 605. When the $n^-$-type region 602 is viewed in the direction perpendicular to the resistive gate electrodes 604 and 605, a channel is formed in the range designated by H.

For scanning the channel formed in this way, rightward, for instance, saw-tooth waves $R_1$ and $R_2$ may be supplied through capacitors between the terminals B and C and between the terminals D and E respectively.

This scanning function obtained by a plurality of resistive gate electrodes embedded in the substrate is shown by the embodiment of FIG. 7.

FIG. 7(a) illustrates a bottom view, 7(b) a sectional view along the line X—X', 7(c) a sectional view along the line Y—Y', and 7(d) an equivalent circuit of a basic cell unit.

A phosphor region 702 of electron beam excitation type and a high-resistivity region 703 are formed in that order on a transparent electrode 701. A p-type region 705 functioning as a second resistive gate electrode divided and isolated along the direction perpendicular to the scanning direction by the insulating member 704 is formed in proximity to the phosphor region 702. (The p-type region 705, which is shown in contact with the phosphor region 702 in FIG. 7, may be separated therefrom.) The p-type region 705 functioning as a second resistive gate electrode is formed continuously along the scanning direction.

On the high-resistivity region 703, an $n^+$-type region 706 providing an electron source and a p-type region 707 sandwiching the $n^+$-type region 706 are separated by the insulating member 708 from each other in the direction perpendicular to the scanning direction and are formed continuously along the scanning direction. The p-type region 707 functions as a first resistive gate electrode.

Further, the $n^+$-type region 706 is connected with a signal transmission line 709 at the opening of the insulating film 708.

The above-mentioned circuit configuration is represented in simple manner by the equivalent circuit of FIG. 7(d).

In FIG. 7(d), a light-emitting region 710 corresponds to the phosphor region 702, an electron source 711 to the $n^+$-type region 706, a first gate 712 to the p-type region 707 functioning as a first resistive gate electrode, and a second gate 713 to the p-type region 705 functioning as a second resistive gate electrode. The hatched portions of the first gate 712 and the second gate 713 represent the range of depletion. In FIG. 7(d), therefore, the channel corresponding to the width K provides a portion where the unscattered running of electrons is possible. (The width shown by K may be set freely, and if this width is narrowed, the object of improving a high resolution is achieved.)

A solid-state image display aparatus with a plurality of the basic cells of FIG. 7 arranged two-dimensionally according to an embodiment of the present invention is shown in FIG. 8. (This illustrates a three-dimensional construction in a two-dimensional manner by use of the equivalent circuit of FIG. 7(d).)

In FIG. 8, phosphor regions 801 are actually formed continuously in a two-dimensional way (although the phosphor regions are shown separated vertically to facilitate the illustration in the drawing). The electron source regions 802 separated vertically represent the respective lines. For each of the lines, electrons from the electron source region 802 intrude into the phosphor region 801 by non-scattering drive through a channel opened by the first gate 803 impressed with the voltage $E_1$ and the second gate 804 impressed with the voltage $E_2$. In this embodiment, horizontal scanning is effected by applying the sawtooth waves $R_1$ and $R_2$ through a capacitor between the terminals B and C and between the terminals D and E respectively. The vertical scanning in not performed in this embodiment but a display output is produced simultaneously for each line. (This is a realization of the condition of Equation (19).)

As seen from the above, the embodiment of the present invention under consideration permits scanning similar to that of conventional CRTs to be performed at a low voltage, so that the driving means is simplified and the power consumption is reduced easily on the one hand and a high resolution is realized very easily on the other hand.

Finally, the operating principle and the construction of the apparatus of the present invention hold good regardless of the reverse polarity or type of semiconductor. (That is to say, the non-scattered running section of holes may be used alternatively.)

It will be understood from the foregoing description that according to the present invention, a combination of the non-scattered running section for electrons and the phosphor region are realized by solid-state material in its entirety, thus leading to the advantages that:

(1) Brightness at least equal to that of CRT may be obtained easily.

(2) Since a low-voltage drive (less than several volts) is possible, the high-density integration of the circuits including the drive section is easy, which operates with a low power consumption.

(3) Utilization of electrons running in a non-scattered manner results in a very high response characteristic.

(4) The fact that the width of scanning is capable of being defined by controlling the depletion range with a pair of resistive gate electrodes facilitates the achievement of a high resolution.

Further, in producing a multi-color apparatus, the phosphor used in the conventional color television sets may be used, thus posing no problem of color reproducibility.

Furthermore, in view of the fact that the applied voltage V of Equation (14) is capable of being changed easily to control the velocity of the electrons running non-scattered, a high resolution of a color apparatus is easily achieved by use of phosphor of the penetration type.

The aforementioned advantages produce a great practical effect as a solid-state image display apparatus which is expected to supersede conventional cathode-ray tubes.

I claim:

1. A solid-state image display device comprising:
   a phosphor region acting as a drain region and formed on a surface of a semiconductor substrate having a low impurity density,
   a carrier supply region of a first conduction type, having a high impurity density and formed on another surface of said semi-conductor substrate, opposite to said surface having said phosphor region formed thereon, and
   a gate region of a second conduction type formed on said another surface of said semiconductor substrate, for controlling an amount of carriers injected from said carrier supply region into said semiconductor substrate, wherein said carriers injected from said carrier supply region into said semiconductor substrate reach said phosphor region by running in a non-scattered manner such that a running distance of said carriers is shorter than a mean free path thereof, thereby causing light emission from said phosphor region.

2. A solid-state image display device according to claim 1, wherein a potential of said gate region is controlled by a potential of a carrier storage region of said second conduction type.

3. A solid-state image display device according to claim 1, further comprising scanning means for selecting positions of a plurality of said gate regions arranged in matrix.

4. A solid-state image display device according to claim 1, wherein said gate region includes a pair of resistive gate regions formed continuously in one scanning direction, and further comprising means for applying DC voltages across respective said resistive gate regions in opposite directions such that potentials across said respective resistive gate regions have opposite polarities, and means for applying a pair of saw-tooth waves in inverted forms in AC fashion to said resistive gate regions respectively.

* * * * *